(12) United States Patent
Popplewell et al.

(10) Patent No.: US 8,786,371 B2
(45) Date of Patent: Jul. 22, 2014

(54) APPARATUS AND METHODS FOR VOLTAGE CONVERTERS

(71) Applicants: Skyworks Solutions, Inc., Woburn, MA (US); Nujira Ltd, Cambridge (GB)

(72) Inventors: Peter Harris Robert Popplewell, Ottawa (CA); Jakub F Pingot, Ottawa (CA); Florinel G Balteanu, Ottawa (CA); Martin Wilson, Caldecote (GB); Mark Tuckwell, Knebworth (GB)

(73) Assignees: Skyworks Solutions, Inc., Woburn, MA (US); Nujira Ltd, Cambridge (GB)

( * ) Notice: Subject to any disclaimer, the term of this patent is extended or adjusted under 35 U.S.C. 154(b) by 70 days.

(21) Appl. No.: 13/671,022

(22) Filed: Nov. 7, 2012

(65) Prior Publication Data

US 2013/0127548 A1 May 23, 2013

Related U.S. Application Data

(60) Provisional application No. 61/561,676, filed on Nov. 18, 2011.

(51) Int. Cl.
*H03F 3/04* (2006.01)
(52) U.S. Cl.
USPC .......................................... 330/297; 330/146
(58) Field of Classification Search
CPC ................ H03F 3/00; H03F 3/26; H03F 3/04
USPC ................... 330/297, 146, 296, 285
See application file for complete search history.

(56) References Cited

U.S. PATENT DOCUMENTS

| | | | | |
|---|---|---|---|---|
| 5,003,271 A | * | 3/1991 | Swanson | 330/298 |
| 5,442,317 A | * | 8/1995 | Stengel | 330/10 |
| 6,211,728 B1 | * | 4/2001 | Chen et al. | 330/10 |
| 6,344,768 B1 | * | 2/2002 | Daun-Lindberg et al. | 327/424 |
| 7,081,598 B2 | | 7/2006 | Ilic et al. | |
| 7,696,736 B2 | | 4/2010 | Latham et al. | |

(Continued)

FOREIGN PATENT DOCUMENTS

| KR | 10-2008-0067378 | 7/2008 |
|---|---|---|
| KR | 10-1096613 | 12/2011 |

OTHER PUBLICATIONS

International Search Report and Written Opinion of the International Search Authority in PCT/US2012/064863 dated Mar. 25, 2013, 10 pages.

*Primary Examiner* — Henry Choe
(74) *Attorney, Agent, or Firm* — Knobbe, Martens, Olson & Bear, LLP

(57) ABSTRACT

Apparatus and methods for voltage converters are provided. In one embodiment, a voltage conversion system includes a bypass circuit and a voltage converter including an inductor and a plurality of switches configured to control a current through the inductor. The bypass circuit includes a first p-type field effect transistor (PFET), a second PFET, a first n-type field effect transistor (NFET), and a second NFET. The first and second NFET transistors and the first and second PFET transistors are electrically connected between a first end and a second end of the inductor such that a source of the first PFET transistor and a drain of the first NFET transistor are electrically connected to the first end of the inductor and such that a drain of the second PFET transistor and a source of the second NFET transistor are electrically connected to the second end of the inductor.

37 Claims, 9 Drawing Sheets

(56) References Cited

U.S. PATENT DOCUMENTS

| | | | |
|---|---|---|---|
| 2005/0024133 A1* | 2/2005 | Midya et al. | 330/10 |
| 2006/0054601 A1 | 3/2006 | Ilic et al. | |
| 2007/0108948 A1 | 5/2007 | Latham et al. | |
| 2008/0239772 A1 | 10/2008 | Oraw et al. | |
| 2009/0033293 A1 | 2/2009 | Xing et al. | |
| 2010/0039086 A1 | 2/2010 | De Stegge et al. | |

* cited by examiner

APPARATUS AND METHODS FOR VOLTAGE CONVERTERS

CROSS-REFERENCE TO RELATED APPLICATIONS

This application claims the benefit of priority under 35 U.S.C. §119(e) of U.S. Provisional Patent Application No. 61/561,676, filed Nov. 18, 2011 entitled "APPARATUS AND METHODS FOR VOLTAGE CONVERTERS", which is herein incorporated by reference in its entirety.

BACKGROUND

1. Field

Embodiments of the invention relate to electronic systems, and in particular, to voltage converters for radio frequency (RF) electronics.

2. Description of the Related Technology

Power amplifiers can be included in mobile devices to amplify a RF signal for transmission via an antenna. For example, in mobile devices having a time division multiple access (TDMA) architecture, such as those found in Global System for Mobile Communications (GSM), code division multiple access (CDMA), and wideband code division multiple access (W-CDMA) systems, a power amplifier can be used to amplify a RF signal having a relatively low power. It can be important to manage the amplification of a RF signal, as a desired transmit power level can depend on how far the user is away from a base station and/or the mobile environment. Power amplifiers can also be employed to aid in regulating the power level of the RF signal over time, so as to prevent signal interference from transmission during an assigned receive time slot.

The power consumption of a power amplifier can be an important consideration. One technique for reducing power consumption of a power amplifier is envelope tracking, in which the voltage level of the power supply of the power amplifier is changed or varied in relation to the envelope of the RF signal. Thus, when the envelope of the RF signal increases, the voltage supplied to the power amplifier can be increased. Likewise, when the envelope of the RF signal decreases, the voltage supplied to the power amplifier can be decreased to reduce power consumption.

A voltage converter, such as a DC-to-DC converter, can be included in an envelope tracker to reduce the design complexity of the envelope tracker and/or to improve the overall power efficiency of the mobile device. For example, an envelope tracker can include a DC-to-DC converter for generating a plurality of DC output voltages and an amplifier for generating the power amplifier supply voltage by adjusting the magnitude of the DC output voltage closest in voltage level to the desired power amplifier supply voltage.

There is a need for improved voltage converters, including, for example, improved voltage converters for use in power amplifier systems.

SUMMARY

In certain embodiments, the present disclosure relates to a voltage conversion system includes a voltage converter and a bypass circuit. The voltage converter includes an inductor and a plurality of switches configured to control a current through the inductor. The bypass circuit includes a first p-type field effect transistor (PFET), a second PFET, a first n-type field effect transistor (NFET), and a second NFET. The first and second NFET transistors and the first and second PFET transistors are electrically connected between a first end and a second end of the inductor such that a source of the first PFET transistor and a drain of the first NFET transistor are electrically connected to the first end of the inductor and such that a drain of the second PFET transistor and a source of the second NFET transistor are electrically connected to the second end of the inductor.

In some embodiments, a drain of the first PFET transistor is electrically connected to a source of the second PFET transistor, to a source of the first NFET transistor, and to a drain of the second NFET transistor.

In various embodiments, a body of the first PFET transistor is electrically connected to a battery voltage and a body of the first NFET transistor is electrically connected to a ground voltage. According to certain embodiments, a body of the second PFET transistor is electrically connected to a boost voltage, the boost voltage having a magnitude greater than the battery voltage. In some embodiments, a body of the second NFET transistor is electrically connected to a switchable voltage, and the switchable voltage is configured to be switched between a voltage equal to about the ground voltage and a voltage greater than the ground voltage based on a magnitude of an output voltage generated by the voltage converter.

In some embodiments, the voltage conversion system further includes a first level shifter and a second level shifter. The first level shifter is configured to generate gate control signals for a gate of the first PFET transistor and for a gate of the first NFET transistor, and the second level shifter is configured to generate gate control signals for a gate of the second PFET transistor and for a gate of the second NFET transistor. In certain embodiments, the first level shifter is electrically powered using the battery voltage and the ground voltage, and the second level shifter is electrically powered using the boost voltage and the switchable voltage so as to prevent the second PFET transistor from breakdown between the gate and the drain. According to a number of embodiments, the voltage conversion system further includes a low drop out regulator configured to generate a regulated voltage, and the inverter is electrically powered using the regulated voltage and the ground voltage. The output of the inverter is configured to generate the switchable voltage based on an input protection control signal.

In some embodiments, the voltage conversion system further includes a diode having an anode electrically connected to the ground supply and a cathode electrically connected to the drain of the first NFET transistor. The diode is configured to protect the first NFET transistor from damage when the first end of the inductor has a voltage less than the ground voltage.

In various embodiments, the plurality of switches of the voltage converter includes a switch having a first end electrically connected to the first end of the inductor and a second end electrically connected to a ground supply. In a number of embodiments, the voltage converter further includes an electrical component disposed in an electrical path between the second end of the switch and the ground supply, and the electrical component has a resistance. In certain embodiments, a body of the first NFET transistor is electrically connected to the second end of the switch.

According to some embodiments, the voltage converter includes a switch control block configured to control the plurality of switches to generate a plurality of output voltages.

In certain embodiments, the present disclosure relates to a bypass circuit for a voltage converter including an inductor and a plurality of switches configured to control a current through the inductor. The bypass circuit includes a first PFET transistor, a first NFET transistor having a drain electrically connected to a source of the first PFET transistor and to a first end of the inductor, a second PFET transistor having a source electrically connected to a drain of the first PFET transistor, and a second NFET transistor having a drain electrically connected to a source of the first NFET transistor and a source electrically connected to a drain of the second PFET transistor and to a second end of the inductor.

In various embodiments, the drain of the first PFET transistor is electrically connected to the source of the first NFET transistor and to the drain of the second NFET transistor.

In some embodiments, the first and second PFETs are each p-type metal oxide semiconductor (PMOS) transistors and the first and second NFETs are each n-type metal oxide semiconductor (NMOS) transistors.

In a number of embodiments, a body of the first PFET transistor is electrically connected to a battery voltage and a body of the first NFET transistor is electrically connected to a ground voltage. In certain embodiments, a body of the second PFET transistor is electrically connected to a boost voltage, the boost voltage having a magnitude greater than the battery voltage. In several embodiments, a body of the second NFET transistor is electrically connected to a switchable voltage, and the switchable voltage is configured to be switchable between a voltage equal to about the ground voltage and a voltage greater than the ground voltage.

According to some embodiments, the bypass circuit further includes a first level shifter and a second level shifter. The first level shifter is configured to generate gate control signals for a gate of the first PFET transistor and for a gate of the first NFET transistor, and the second level shifter configured to generate gate control signals for a gate of the second PFET transistor and for a gate of the second NFET transistor. In some embodiments, the first level shifter is electrically powered using the battery voltage and the ground voltage, and the second level shifter is electrically powered using the boost voltage and the switchable voltage so as to prevent the second PFET transistor from breakdown between the gate and the drain.

In some embodiments, the bypass circuit further includes a diode having an anode electrically connected to the ground supply and a cathode electrically connected to the drain of the first NFET transistor. The diode is configured to protect the first NFET transistor from breakdown between the body and the drain when the first end of the inductor has a voltage less than the ground voltage.

In certain embodiments, the present disclosure relates to a method of reducing ringing in a voltage converter including an inductor and a plurality of switches for controlling a current through the inductor. The method includes generating a plurality of output voltages using the voltage converter and bypassing the inductor using a bypass circuit. The bypass circuit includes a first PFET, a second PFET, a first NFET, and a second NFET. The first and second NFET transistors and the first and second PFET transistors are electrically connected between a first end and a second end of the inductor such that a source of the first PFET transistor and a drain of the first NFET transistor are electrically connected to the first end of the inductor and such that a drain of the second PFET transistor and a source of the second NFET transistor are electrically connected to the second end of the inductor.

In some embodiments, the method further includes biasing a body of the second PFET transistor at a voltage that is greater than a voltage of a body of the first PFET transistor.

In various embodiments, the method further includes biasing a body of the first NFET transistor to a ground voltage and biasing a body of the second NFET transistor to a switchable voltage.

In according with several embodiments, the method further includes increasing the voltage of the switchable voltage above that of the ground voltage when generating at least one of the plurality of output voltages.

In certain embodiments, the present disclosure relates to a wireless device. The wireless device includes a battery having a battery voltage, a voltage converter, and a bypass circuit. The voltage converter includes an inductor and a plurality of switches configured to control a current through the inductor, and the voltage converter is configured to generate a plurality of output voltages from the battery voltage. The bypass circuit includes a first PFET, a second PFET, a first NFET, and a second NFET. The first and second NFET transistors and the first and second PFET transistors are electrically connected between a first end and a second end of the inductor such that a source of the first PFET transistor and a drain of the first NFET transistor are electrically connected to the first end of the inductor and such that a drain of the second PFET transistor and a source of the second NFET transistor are electrically connected to the second end of the inductor.

In various embodiments, a drain of the first PFET transistor is electrically connected to a source of the second PFET transistor, to a source of the first NFET transistor, and to a drain of the second NFET transistor. In some embodiments, a body of the first PFET transistor is electrically connected to the battery voltage and a body of the first NFET transistor is electrically connected to a ground voltage.

In accordance with certain embodiments, a body of the second PFET transistor is electrically connected to a boost voltage, and the boost voltage having a magnitude greater than the battery voltage. In certain embodiments, a body of the second NFET transistor is electrically connected to a switchable voltage, and the switchable voltage is configured to be switched between a voltage equal to about the ground voltage and a voltage greater than the ground voltage based on a magnitude of one of the plurality of output voltages generated by the voltage converter.

In certain embodiments, the wireless device further includes a first level shifter and a second level shifter. The first level shifter is configured to generate gate control signals for a gate of the first PFET transistor and for a gate of the first NFET transistor, and the second level shifter is configured to generate gate control signals for a gate of the second PFET transistor and for a gate of the second NFET transistor. In some embodiments, the first level shifter is electrically powered using the battery voltage and the ground voltage, and the second level shifter is electrically powered using the boost voltage and the switchable voltage so as to prevent the second PFET transistor from breakdown between the gate and the drain.

In certain embodiments, the wireless device further includes a plurality of output switches and a voltage adjustment module. The plurality of output switches is configured to select amongst the plurality of output voltages, and the voltage adjustment module is configured to generate a power amplifier supply voltage by adjusting a voltage magnitude of the selected output voltage.

In several embodiments, the wireless device further includes a power amplifier configured to receive the power amplifier supply voltage.

In some embodiments, the plurality of output voltages includes at least one output voltage having a magnitude greater than a magnitude of the battery voltage.

In certain embodiments, the plurality of output voltages includes at least one output voltage having a magnitude less than a magnitude of the battery voltage.

DETAILED DESCRIPTION OF EMBODIMENTS

The headings provided herein, if any, are for convenience only and do not necessarily affect the scope or meaning of the claimed invention.

Overview of Power Amplifier Systems

Figure 1:
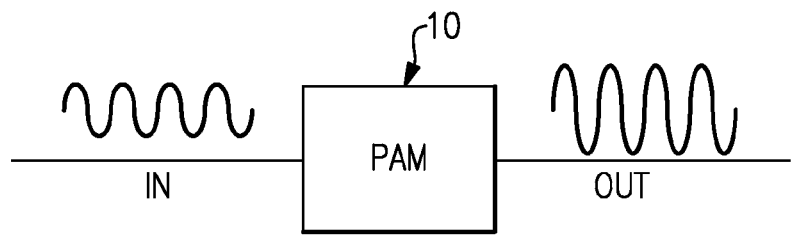
FIG. 1 is a schematic diagram of a power amplifier module for amplifying a radio frequency (RF) signal.

FIG. 1 is a schematic diagram of a power amplifier module 10 for amplifying a radio frequency (RF) signal. The illustrated power amplifier module 10 can be configured to amplify an RF signal IN to generate an amplified RF signal OUT. As described herein, the power amplifier module 10 can include one or more power amplifiers.

Figure 2:
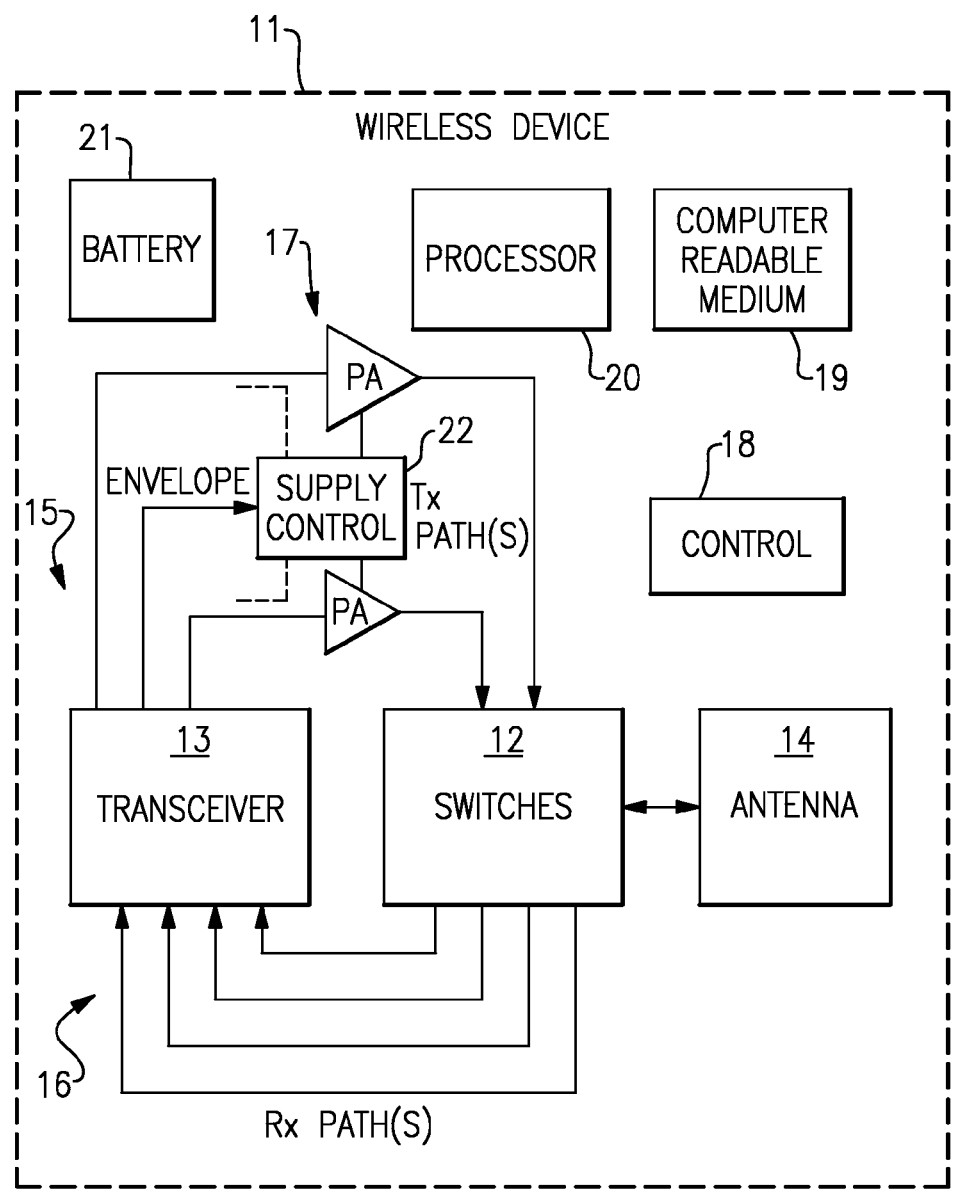
FIG. 2 is a schematic block diagram of an example wireless device that can include one or more of the power amplifier modules of FIG. 1.

FIG. 2 is a schematic block diagram of an example wireless device 11 that can include one or more of the power amplifier modules 10 of FIG. 1. The wireless device 11 can also include a voltage converter implementing one or more features of the present disclosure.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, about 22 radio frequency spectrum bands.

One or more features of the present disclosure can be implemented in the foregoing example modes and/or bands, and in other communication standards. For example, 3G, 4G, LTE, and Advanced LTE are non-limiting examples of such standards.

In certain embodiments, the wireless device 11 can include switches 12, a transceiver 13, an antenna 14, power amplifiers 17, a control component 18, a computer readable medium 19, a processor 20, a battery 21, and a supply control block 22.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 2 illustrates the wireless device 11 as including two transmission paths 15, the wireless device 11 can be adapted to include more or fewer transmission paths 15.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with. Although FIG. 2 illustrates the wireless device 11 as including four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can provide a number of switching functionalities associated with operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12, the power amplifiers 17, the supply control block 22, and/or other operating components.

In certain embodiments, a processor 20 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 19 that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

The illustrated wireless device 11 also includes the supply control block 22, which can be used to provide a power supply voltage to one or more of the power amplifiers 17. For example, the supply control block 22 can include an envelope tracker configured to change or vary the voltage level of the supply voltage provided to the power amplifiers 17 based upon an envelope of the RF signal to be amplified. However, in certain embodiments the supply control block 22 can include different components.

The supply control block 22 can be electrically connected to the battery 21, and the supply control block 22 can be configured to generate the supply voltage for the power amplifiers 17. The battery 21 can be any suitable battery for use in the wireless device 11, including, for example, a lithium-ion battery. As will be described in detail further below, by varying the voltage provided to the power amplifiers, the power consumed from the battery 21 can be reduced, thereby improving battery life of the wireless device 11. In certain implementations, the supply control block 22 can control the power amplifier supply voltage based on an envelope of the RF signal to be amplified. The envelope signal can be provided to the supply control block 22 from the transceiver 13. However, the envelope can be determined in other ways. For example, the envelope can be determined by detecting the envelope from the RF signal using any suitable envelope detector.

Figure 3:
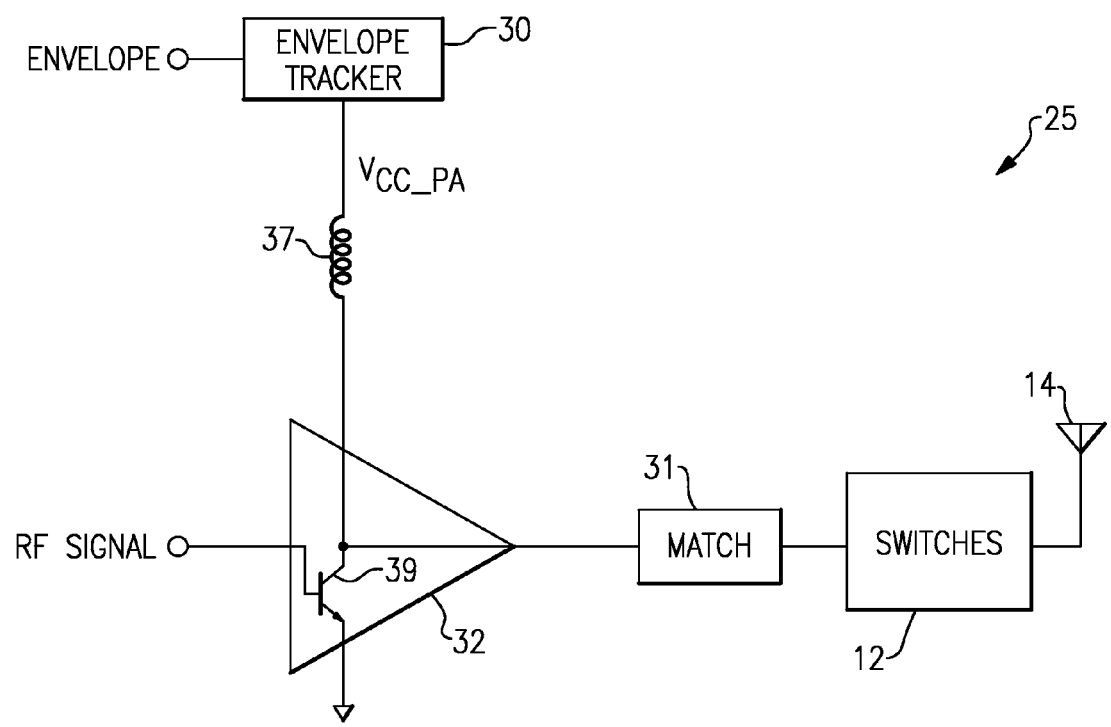
FIG. 3 is a schematic block diagram of one example of a power amplifier system including an envelope tracker.

FIG. 3 is a schematic block diagram of one example of a power amplifier system 25 including an envelope tracker 30. The illustrated power amplifier system 25 includes the envelope tracker 30, a power amplifier 32, an inductor 37, an impedance matching block 31, the switches 12, and the antenna 14. The illustrated envelope tracker 30 is configured to receive an envelope of the RF signal and to generate a power amplifier supply voltage $V_{CC\_PA}$ for the power amplifier 32.

The illustrated power amplifier 32 includes a bipolar transistor 39 having an emitter, a base, and a collector. The emitter of the bipolar transistor 39 can be electrically connected to a ground supply, and a radio frequency (RF) signal can be provided to the base of the bipolar transistor 39. The bipolar transistor 39 can amplify the RF signal and provide the amplified RF signal at the collector. The bipolar transistor 39 can be any suitable device. In one implementation, the bipolar transistor 39 is a heterojunction bipolar transistor (HBT).

The power amplifier 32 can be configured to provide the amplified RF signal to the switches 12. The impedance matching block 31 can be used to aid in terminating the electrical connection between the power amplifier 32 and the switches 12. For example, the impedance matching block 31 can be used to increase power transfer and/or reduce reflections of the amplified RF signal generated using the power amplifier 32.

The inductor 37 can be included to aid in biasing the power amplifier 32 with the power amplifier supply voltage $V_{CC\_PA}$ generated by the envelope tracker 30. The inductor 37 can include a first end electrically connected to the envelope tracker 30, and a second end electrically connected to the collector of the bipolar transistor 39.

Although FIG. 3 illustrates one implementation of the power amplifier 32, skilled artisans will appreciate that the teachings described herein can be applied to a variety of power amplifier structures, such as multi-stage power amplifier structures and power amplifiers employing other transistor structures. For example, in some implementations the bipolar transistor 39 can be omitted in favor of employing a field-effect transistor (FET), such as a silicon FET, a gallium arsenide (GaAs) high electron mobility transistor (HEMT), or a laterally diffused metal oxide semiconductor (LDMOS) transistor.

Figure 4A:
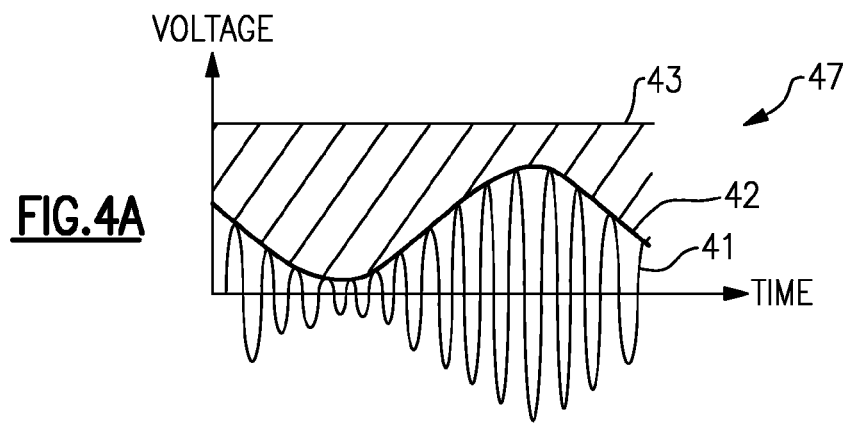
FIGS. 4A-4C show three examples of power supply voltage versus time.
Figure 4B:
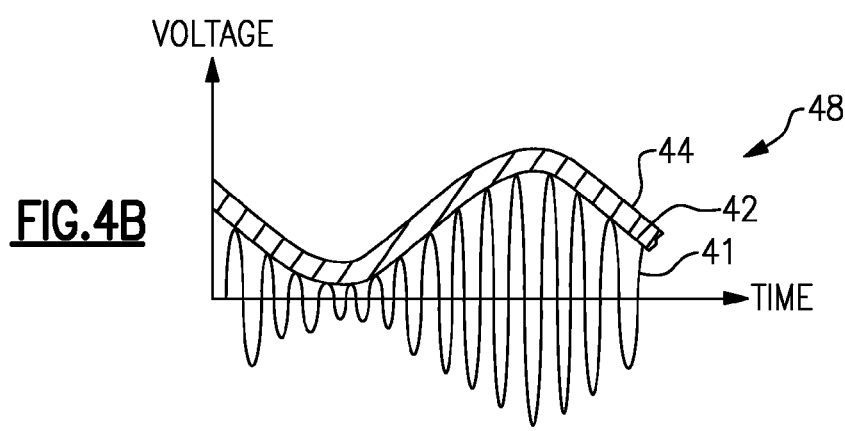
Figure 4C:
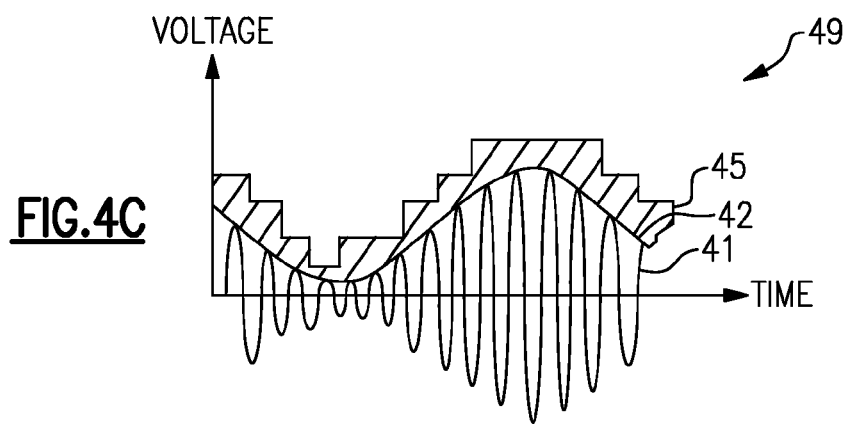

FIGS. 4A-4C show three examples of power supply voltage versus time.

In FIG. 4A, a graph 47 illustrates the voltage of an RF signal 41 and a power amplifier supply voltage 43 versus time. The RF signal 41 has an envelope 42.

It can be important that the power supply voltage 43 of a power amplifier has a voltage greater than that of the RF signal 41. For example, providing a power supply voltage to a power amplifier having a magnitude less than that of the RF signal 41 can clip the RF signal, thereby creating signal distortion and/or other problems. Thus, it can be important the power supply voltage 43 be greater than that of the envelope 42. However, it can be desirable to reduce a difference in voltage between the power amplifier supply voltage 43 and the envelope 42 of the RF signal 41, as the area between the power amplifier supply voltage 43 and the envelope 42 can represent lost energy, which can reduce battery life and increase heat generated in a mobile device.

In FIG. 4B, a graph 48 illustrates the voltage of an RF signal 41 and a power amplifier supply voltage 44 versus time. In contrast to the power amplifier supply voltage 43 of FIG. 4A, the power amplifier supply voltage 44 of FIG. 4B varies in relation to the envelope 42 of the RF signal 41. The area between the power amplifier supply voltage 44 and the envelope 42 in FIG. 4B is less than the area between the power amplifier supply voltage 43 and the envelope 42 in FIG. 4A, and thus the graph 48 of FIG. 4B can be associated with a power amplifier system having greater energy efficiency.

FIG. 4C is a graph 49 illustrating a power supply voltage 45 that varies in relation to the envelope 42 of the RF signal 41. In contrast to the power supply voltage 44 of FIG. 4B, the power supply voltage 45 of FIG. 4C varies in discrete voltage increments. Certain embodiments described herein can be employed in supply control blocks that vary a power supply voltage for a power amplifier in discrete increments.

Figure 5:
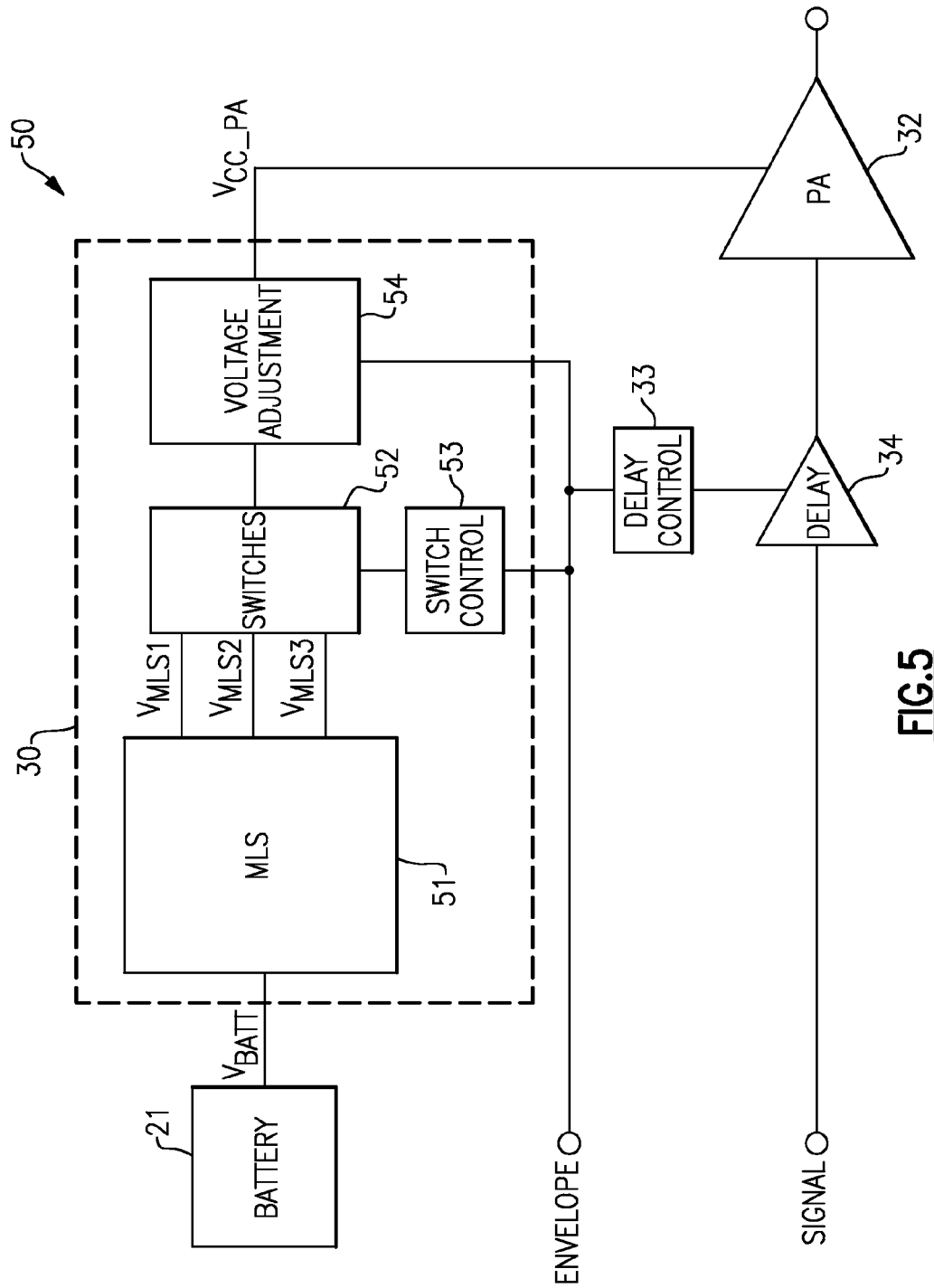
FIG. 5 is a schematic block diagram of another example of a power amplifier system including an envelope tracker.

FIG. 5 is a schematic block diagram of another example of a power amplifier system 50 including an envelope tracker 30. The illustrated power amplifier system 50 includes the battery 21, the envelope tracker 30, the power amplifier 32, a delay control block 33, and a delay element 34. The envelope tracker 30 includes a multi-level supply control module 51, switches 52, a switch control block 53, and a voltage adjustment module 54.

As shown in FIG. 5, the example power amplifier system 50 can receive an RF signal and an envelope of the RF signal, and can use the envelope to generate a supply voltage $V_{CC\_PA}$ for the power amplifier 32. In order to compensate for delays in generating the power amplifier supply voltage $V_{CC\_PA}$, the delay element 34 and the delay control block 33 can be included. For example, the delay control block 33 can be used to control the delay of the delay element 34 based on the envelope of the RF signal to help align the RF signal and the power amplifier supply voltage $V_{CC\_PA}$.

The multi-level supply control module 51 can be included in the envelope tracker 30 and can be used to generate a plurality of substantially DC output voltages from the battery 21. For example, the multi-level supply control module 51 can be used to generate output voltages $V_{MLS1}$, $V_{MLS2}$ and $V_{MLS3}$ from the battery voltage $V_{BATT}$. Although the multi-level supply control module 51 is illustrated as generating three output voltages, the multi-level supply control module 51 can be configured to generate more or fewer output voltages. The multi-level supply control module 51 can include, for example, a buck-boost converter or any other suitable DC-to-DC converter.

The switch control block 53 can be configured to select amongst the output voltages generated by the multi-level supply control module 51 to aid in providing the power amplifier 32 with an appropriate supply voltage. The voltage selected by the switch control block 53 can be adjusted by a voltage adjustment module 54 before being provided to one or more power amplifiers, such as the power amplifier 32. For example, the voltage adjustment module 54 can include an amplifier configured to provide linear tracking of the envelope signal to generate the power supply voltage $V_{CC}$. In certain implementations, the voltage adjustment module 54 can include an amplifier and an adder, and the adder can add an error signal from the amplifier to the output voltage selected by the switches 52 to generate the power amplifier supply voltage $V_{CC\_PA}$.

By providing both the multi-level supply control module 51 and the voltage adjustment module 54, constraints on the design of the envelope tracker 30 can be reduced, thereby permitting a system with greater flexibility and improved power efficiency.

Overview of Voltage Converter Circuits

Figure 6:
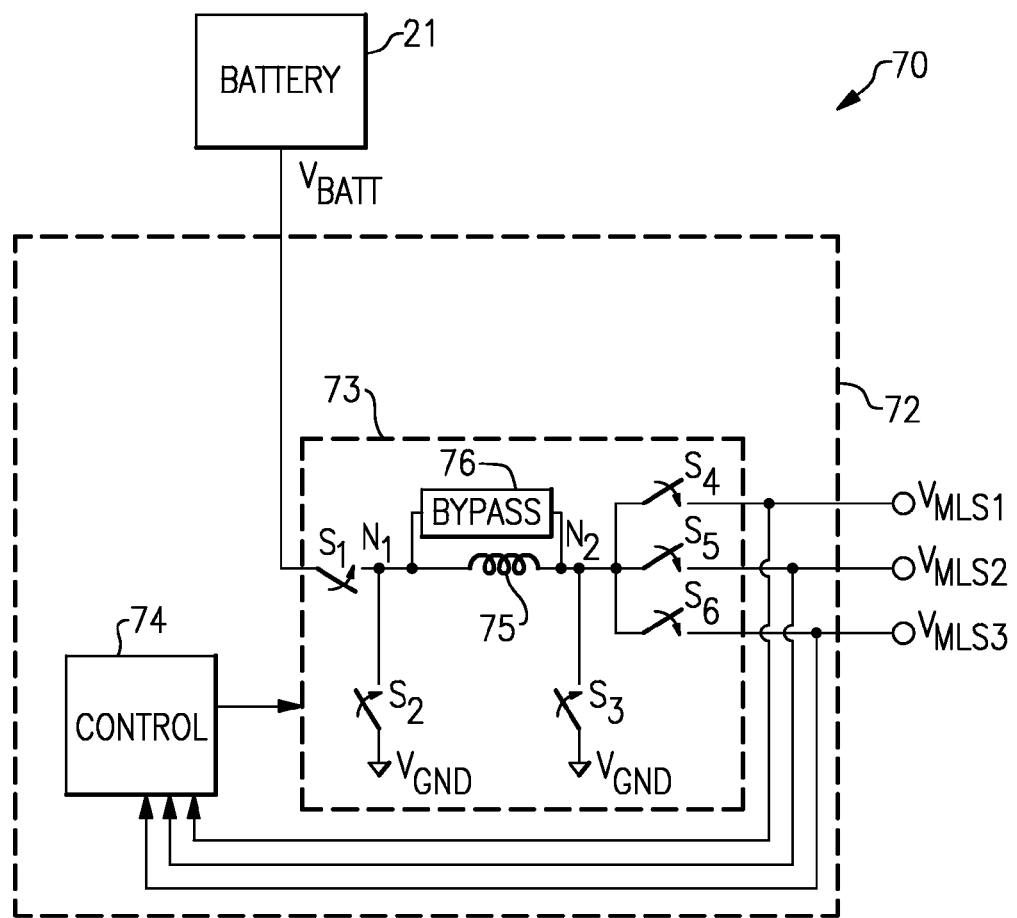
FIG. 6 is a circuit diagram of one embodiment of a multi-level supply control module and a battery.

FIG. 6 is a circuit diagram of one embodiment of a portion of an electronic system 70 including a multi-level supply control module 72 and a battery 21. The multi-level supply control module 72 is configured to receive a battery voltage $V_{BATT}$ from the battery 21 and to generate a plurality of output voltages. For example, in the configuration illustrated in FIG. 6, the multi-level supply control module 72 is configured to generate a first output voltage $V_{MLS1}$, a second output voltage $V_{MLS2}$, and a third output voltage $V_{MLS3}$. However, the multi-level supply control module 72 can be configured to generate more or fewer output voltages.

The multi-level supply control module 72 includes a buck-boost converter 73 and a control block 74. The buck-boost converter 73 includes first to sixth switches $S_1$-$S_6$, an inductor 75, and a bypass circuit 76. The first switch $S_1$ includes a first end electrically connected to the battery voltage $V_{BATT}$ and a second end electrically connected to a first end of the second switch $S_2$, to a first end of the inductor 75, and to a first end of the bypass circuit 76 at a node $N_1$. The second switch $S_2$ further includes a second end electrically connected to a first or ground supply $V_{GND}$. Although FIG. 2 illustrates a configuration of a voltage converter that is powered using a ground supply and a battery voltage, the teachings herein are applicable to voltage converters powered using any suitable power high supply and power low supply. The inductor 75 further includes a second end electrically connected to a second end of the bypass circuit 76 and to a first end of each of the third to sixth switches $S_3$-$S_6$ at a node $N_2$. The third switch $S_3$ further includes a second end electrically connected to the ground supply $V_{GND}$. The fourth, fifth, and sixth switches $S_4$-$S_6$ each include a second end configured to generate the first, second, and third output voltages $V_{MLS1}$, $V_{MLS2}$, and $V_{MLS3}$, respectively.

The control block 74 is configured to receive the first, second, and third output voltages $V_{MLS1}$, $V_{MLS2}$, and $V_{MLS3}$, and can control the buck-boost converter 73 based on the voltage level of the first, second, and third output voltages $V_{MLS1}$, $V_{MLS2}$, and $V_{MLS3}$. For example, the control block 74 can be configured to generate control signals for turning on and off the first to sixth switches $S_1$-$S_6$ to maintain the first, second, and third output voltages $V_{MLS1}$, $V_{MLS2}$, and $V_{MLS3}$, within a particular error tolerance of target voltage levels.

The control module 74 can be configured to control the buck-boost converter 73 so as to generate one or more boost voltages having a magnitude greater than that of the battery voltage $V_{BATT}$. For instance, when the buck-boost converter 73 is operating continuously, the control block 74 can generate a boosted voltage on the first output voltage $V_{MLS1}$ by regularly switching the state of the first to sixth switches $S_1$-$S_6$ between a configuration associated with a first boost phase of the buck-boost converter 73 and a configuration associated with a second boost phase of the buck-boost converter 73. For example, during the first boost phase of the buck-boost converter 73, the control block 74 can be configured to open the second and fourth to sixth switches $S_2$, $S_4$-$S_6$ and to close the first and third switches $S_1$, $S_3$ so as to increase the magnetic field of the inductor 75 by providing a current from the battery 21 to the ground supply $V_{GND}$ through the inductor 75 and the first and third switches $S_1$, $S_3$. Additionally, during the second boost phase of the buck-boost converter 73, the control block 74 can be configured to close the second and fourth switches $S_2$, $S_4$ and to open the first, third, fifth, and sixth switches $S_1$, $S_3$, $S_5$-$S_6$ such that the magnetic field of the inductor 75 generates a current from the ground supply $V_{GND}$ to the first output voltage $V_{MLS1}$, through the inductor 75 and the second and fourth switches $S_2$, $S_4$.

Although the buck-boost converter 73 has been described as being operated over two phases when generating a boost voltage, the buck-boost converter can be configured to operate using additional phases. For instance, the buck-boost converter 73 can be configured to operate intermittently with the control block 74 configured to switch the buck-boost converter 73 between the first boost phase, the second boost phase, and a third boost phase associated with opening each of the first to sixth switches $S_1$-$S_6$. In some implementations, intermittent operation can be employed in the buck-boost converter 73 to aid in preventing the buck-boost converter 73 from over charging the output voltages $V_{MLS1}$-$V_{MLS3}$ when the output voltages $V_{MLS1}$-$V_{MLS3}$ have a relatively light current load.

The control module 74 can also be configured to control the buck-boost converter 73 so as to generate one or more buck voltages having a magnitude less than that of the battery voltage $V_{BATT}$. For instance, when the buck-boost converter 73 is operating continuously, the control block 74 can generate a buck voltage on the third output voltage $V_{MLS3}$ by regularly switching the state of the first to sixth switches $S_1$-$S_6$ between a configuration associated with a first buck phase of the buck-boost converter 73 and a configuration associated with a second buck phase of the buck-boost converter 73. For example, during the first buck phase of the buck-boost converter 73, the control block 74 can be configured to open the second to fifth switches $S_2$-$S_5$ and to close the first and sixth switches $S_1$, $S_6$ so as to charge the magnetic field of the inductor 75 by providing a current from the battery 21 to the third output voltage $V_{MLS3}$ through the inductor 75 and the first and sixth switches $S_1$, $S_6$. Additionally, during the second buck phase of the buck-boost converter 73, the control block 74 can be configured to close the second and sixth switches $S_2$, $S_6$ and to open the first and third to fifth switches $S_1$, $S_3$-$S_5$ such that the magnetic field of the inductor 75 generates a current from the ground supply $V_{GND}$ to the third output voltage $V_{MLS3}$ through the inductor 75 and the second and sixth switches $S_2$, $S_6$.

Although the buck-boost converter 73 has been described as being operated over two phases when generating a buck voltage, the buck-boost converter can be configured to operate using additional phases. For instance, the buck-boost converter 73 can be configured to operate intermittently with the control block 74 configured to switch the buck-boost converter 73 between the first buck phase, the second buck phase, and a third buck phase associated with opening each of the first to sixth switches $S_1$-$S_6$.

The multi-level supply control module 72 can be configured to generate any suitable combination of buck and/or boost voltages. For example, in some implementations, the first and second output voltages $V_{MLS1}$, $V_{MLS2}$ are boost voltages and the third output voltage $V_{MLS3}$ is a buck voltage. However, in other implementations, the buck-boost converter 73 can be configured to generate all buck or all boost voltages. Furthermore, the multi-level supply control module 72 can be configured to generate more or fewer output voltages.

When generating buck and/or boost voltages using the buck-boost converter 73, switching of the first to sixth switches $S_1$-$S_6$ can lead to ringing in the inductor 75. For example, when the control block 74 determines that the first, second and third output voltages $V_{MLS1}$-$V_{MLS3}$ are each charged to a desired voltage level, the control block 74 may open each of the fourth to sixth switches $S_4$-$S_6$. Similarly, when operating intermittently, the buck-boost converter 73 may be in a state in which the first to sixth switches $S_1$-$S_6$ are each opened. Energy associated with the magnetic field of the inductor 75 may result in voltage spikes on the first node $N_1$ and/or second node $N_2$ when transitioning the first to sixth switches $S_1$-$S_6$ between certain states. In certain configurations, the ringing of the inductor 75 can result in voltage spikes that can exceed maximum voltage operating conditions and/or can lead to spurs that can generate receive band noise in the electronic system 70.

To aid in reducing ringing within the buck-boost converter 73, the bypass circuit 76 has been included. The control block 74 can be configured to control the bypass circuit 76 between a deactivated or high-impedance state and an activated or low-impedance state. In some implementations, the control block 74 can be configured to activate the bypass circuit 76 at certain times so as to reduce ringing of the inductor current and to reduce voltage spikes on the first node $N_1$ and/or the second node $N_2$. For example, when the first to sixth switches $S_1$-$S_6$ are each in an opened state, the control block 74 can activate the bypass circuit 76 so as to electrically short the first node $N_1$ to the second node $N_2$ and reduce ringing. However, the control block 74 can be configured to activate the bypass circuit 76 at other times.

Electrically connecting the bypass circuit 76 in parallel with the inductor 75 can enhance performance of the buck-boost converter 73 relative to certain other bypass schemes. For example, electrically connecting the bypass circuit 76 in parallel with the buck-boost converter 73 can offer improved performance relative to a scheme in which the first and second nodes $N_1$, $N_2$ are shorted to the ground supply $V_{GND}$ during bypass, since parasitic capacitances associated with the first and second nodes $N_1$, $N_2$ need not be recharged after bypass and additional conditioning circuitry for preventing shorts between the output voltages $V_{MLS1}$-$V_{MLS3}$ and the ground supply $V_{GND}$ need not be included.

Figure 7:
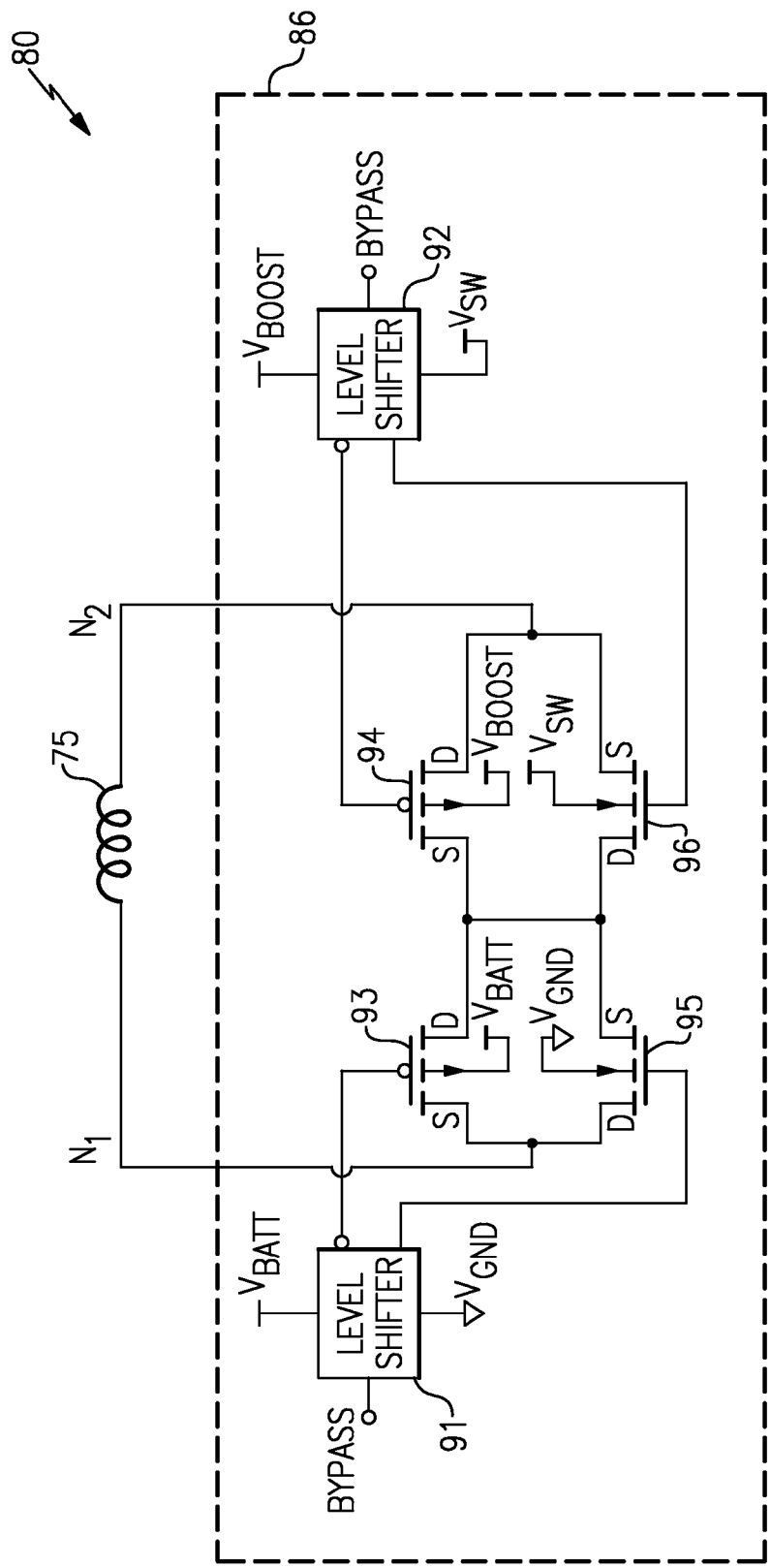
FIG. 7 is a circuit diagram of one embodiment of a bypass circuit and an inductor.

FIG. 7 is a circuit diagram 80 of one embodiment of a bypass circuit 86 and an inductor 75. The bypass circuit 86 includes a first level shifter 91, a second level shifter 92, a first p-type metal oxide semiconductor (PMOS) transistor 93, a second PMOS transistor 94, a first n-type metal oxide semiconductor (NMOS) transistor 95, and a second NMOS transistor 96. The bypass circuit 86 includes an input for receiving a bypass control signal BYPASS, and the bypass circuit 86 is electrically connected in parallel with the inductor 75. As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics.

The first and second level shifters 91, 92 each include an input configured to receive the bypass control signal BYPASS. The first level shifter 91 includes a first or non-inverted output electrically connected to a gate of the first NMOS transistor 95 and a second or inverted output electrically connected to a gate of the first PMOS transistor 93. The first level shifter 91 is electrically powered using a battery voltage $V_{BATT}$ and a ground supply $V_{GND}$. The second level shifter 92 includes a first or non-inverted output electrically connected to a gate of the second NMOS transistor 96 and a second or inverted output electrically connected to a gate of the second PMOS transistor 94. The second level shifter 92 is electrically powered using a boost voltage $V_{BOOST}$ and a switch supply $V_{SW}$.

The first PMOS transistor 93 includes a source electrically connected to a drain of the first NMOS transistor 95 and to a first end of the inductor 75 at the first node $N_1$. The first PMOS transistor 93 further includes a drain electrically connected to a source of the first NMOS transistor 95, to a drain of the second NMOS transistor 96, and to a source of the second PMOS transistor 94. The first PMOS transistor 93 further includes a body electrically connected to the battery voltage $V_{BATT}$, and the first NMOS transistor 95 further includes a body electrically connected to the ground supply $V_{GND}$. The second PMOS transistor 94 further includes a drain electrically connected to a source of the second NMOS transistor 96 at the second node $N_2$. The second PMOS transistor 94 further includes a body electrically connected to a boost voltage $V_{BOOST}$, and the second NMOS transistor 96 further includes a body electrically connected to a switchable voltage $V_{SW}$. The first and second PMOS transistors 93, 94 and the first and second NMOS transistors 95, 96 are electrically connected in a bridge between the first and second ends of the inductor 75.

The voltage levels of the battery voltage $V_{BATT}$, the boost voltage $V_{BOOST}$, and the switchable voltage $V_{SW}$ can have any suitable voltage level relative to the ground supply $V_{GND}$. In one implementation, the battery voltage $V_{BATT}$ ranges between about 2.5 V and about 5.25 V, and the boost voltage $V_{BOOST}$ is selected to be between about 0.15 V to about 2.9 V greater than the battery voltage $V_{BATT}$. In one embodiment, the boost voltage $V_{BOOST}$ is selected to be one of the output voltages generated using the voltage converter, such as the output voltage of the voltage converter having the largest voltage magnitude. For example, with reference back to FIG. 6, when boosting the first output voltage $V_{MLS1}$ of the buck-boost converter 73 above the battery voltage $V_{BATT}$, the first output voltage $V_{MLS1}$ can be used as the boost voltage $V_{BOOST}$.

In certain configurations, the switchable voltage $V_{SW}$ is switchable between a voltage about equal to the ground supply $V_{GND}$ and a voltage in the range of about 1.7 V to about 1.9 V. Additional details of the switchable voltage $V_{SW}$ will be described further below. Although particular voltage levels have been described above, other voltage levels will be readily determined by one of skill in the art.

When the bypass control signal BYPASS is logically high, the non-inverted and inverted outputs of the first level shifter 91 can be equal to about the voltages of the battery voltage $V_{BATT}$ and the ground supply $V_{GND}$, respectively, and the non-inverted and inverted outputs of the second level shifter 92 can be equal to about the voltages of the boost voltage $V_{BOOST}$ and the switchable voltage $V_{SW}$, respectively. Thus, the bypass control signal BYPASS and the first and second level shifters 91, 92 can be used to turn on the first and second PMOS transistors 93, 94 and the first and second NMOS transistors 95, 96. However, when the bypass control signal BYPASS is logically low, the non-inverted and inverted outputs of the first level shifter 91 can be equal to about the voltages of the ground supply $V_{GND}$ and the battery voltage $V_{BATT}$, respectively, and the non-inverted and inverted outputs of the second level shifter 92 can be equal to about the voltages of the switchable voltage $V_{SW}$ and the boost voltage $V_{BOOST}$, respectively. Accordingly, the first and second PMOS transistors 93, 94 and the first and second NMOS transistors 95, 96 can be off when the bypass control signal BYPASS is logically low.

The bypass circuit 86 can be included in a voltage converter that includes the inductor 75, and can be used to bypass the inductor 75 to reduce ringing. For example, the bypass circuit 86 of FIG. 7 can operate as the bypass circuit 76 in the buck-boost converter 73 of FIG. 6 and can be used to bypass the inductor 75 when the buck-boost converter 73 is operating intermittently and/or during any other suitable configuration, such as when the first to sixth switches $S_1$-$S_6$ are each in an opened state. When the bypass circuit 86 of FIG. 7 is included in the buck-boost converter 73 of FIG. 6, the bypass circuit can be electrically connected such that the first and second nodes $N_1$, $N_2$ of FIG. 7 correspond to the first and second nodes $N_1$, $N_2$ of FIG. 6.

Although the bypass circuit 76 can be used in the buck-boost converter 73 of FIG. 6, the bypass circuit 76 can be used in a wide array of ICs and other electronics, including, for example, in buck converters, boost converters, or voltage converters having different circuit topologies.

The battery voltage $V_{BATT}$ can be generated by a battery, and thus the battery voltage $V_{BATT}$ can have a voltage level that varies in relation to the battery charge level. Accordingly, when the battery has a relatively small charge, the battery voltage can be relatively small. However, a voltage converter can use the battery voltage $V_{BATT}$ to generate a plurality of output voltages, including boosted output voltages that have a voltage greater than the battery voltage $V_{BATT}$.

The first and second PMOS transistors 93, 94 and the first and second NMOS transistors 95, 96 have been electrically connected in a configuration that allows the transistors to have a relatively high voltage tolerance. For example, the first and second PMOS transistors 93, 94 and the first and second NMOS transistors 95, 96 can have a maximum operating voltages, such as maximum gate-drain, gate-source, bulk-drain, and bulk-source breakdown voltages, and the transistors have been configured to avoid breaking down even when the energy in the magnetic field of the inductor 75 causes ringing.

For example, to improve the robustness of the bypass circuit 86 to voltage spikes on the second node $N_2$, including when the battery voltage $V_{BATT}$ has a relatively low voltage level, the body of the second PMOS transistor 94 has been electrically connected to the boost voltage $V_{BOOST}$ and the body of the second NMOS transistor 96 has been electrically connected to the switchable voltage $V_{SW}$. Additionally, in contrast to the first level shifter 91 that is electrically powered using the battery voltage $V_{BATT}$ and the ground supply $V_{GND}$, the second level shifter 92 has been electrically powered using the boost voltage $V_{BOOST}$ and the switchable voltage $V_{SW}$.

As will be described in detail below, the boost voltage $V_{BOOST}$ can have a voltage magnitude that is greater than the voltage magnitude of the battery voltage $V_{BATT}$. Additionally, when a voltage converter is generating a relatively large output voltage, the switchable voltage $V_{SW}$ can be increased so as to have a voltage magnitude that is greater than the voltage magnitude of the ground supply $V_{GND}$. By configuring the boost voltage $V_{BOOST}$ and the switchable voltage $V_{SW}$ in this manner, the first and second PMOS transistors 93, 94 and the first and second NMOS transistors 95, 96 can operate within safe operating voltage limits, even when the voltage magnitude of the battery voltage $V_{BATT}$ is relatively low and/or the second node $N_2$ has a relatively large voltage swing. Accordingly, the bypass circuit 86 of FIG. 7 can be employed in a voltage converter to reduce inductor current ringing relative to a scheme omitting the bypass circuit 86. In some implementations, the bypass circuit 86 does not use high voltage or other special transistors for the first and second PMOS transistors 93, 94 and the first and second NMOS transistors 95, 96, thereby reducing circuit layout area and/or enhancing operational performance of a voltage converter employing the bypass circuit 86. In some implementations, the bypass circuit 86 uses high voltage or other special transistors in the bypass circuit 86 to allow the voltage converter to operate at even higher output voltage levels.

Although FIG. 7 illustrates a configuration using MOS transistors, the bypass circuits described herein can use other transistor structures, including, for example, other field effect transistors (FETs). Accordingly, in certain implementations, the transistors 93-96 can be metal-semiconductor FETs (MESFETS), junction FETs (JFETs), and/or any other suitable type of transistor.

Figure 8:
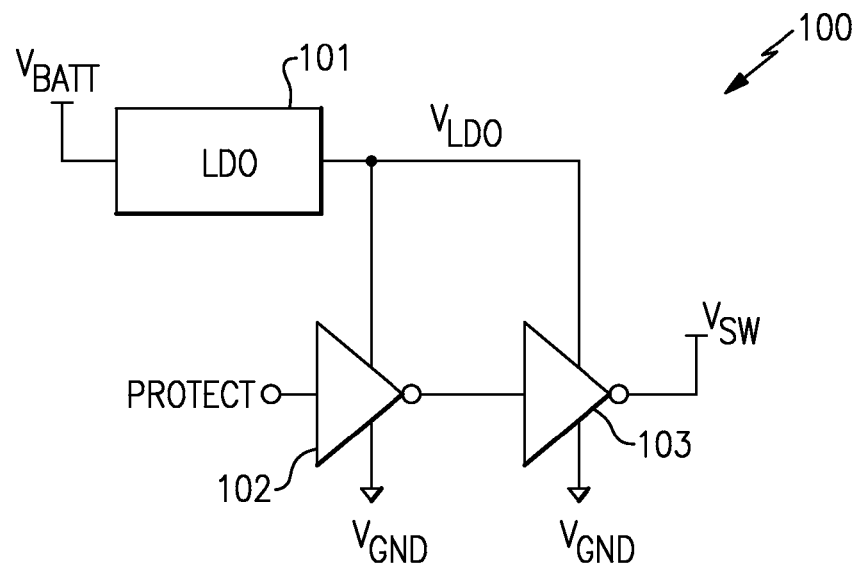
FIG. 8 is a circuit diagram of one embodiment of a voltage generator for generating the switchable voltage of FIG. 7.

FIG. 8 is a circuit diagram of one embodiment of a voltage generator 100 for generating the switchable voltage $V_{SW}$ of FIG. 7. The voltage generator 100 includes a low-dropout regulator (LDO) 101, a first inverter 102, and a second inverter 103. The voltage generator 100 is configured to receive a protection control signal PROTECT. Additionally, the voltage generator 100 is configured to receive the battery voltage $V_{BATT}$ and to generate the switchable voltage $V_{SW}$.

The first inverter 102 includes an input configured to receive the protect signal PROTECT and an output electrically connected to an input of the second inverter 103. The second inverter 103 further includes an output configured to generate the switchable voltage $V_{SW}$. The LDO 101 includes an input configured to receive the battery voltage $V_{BATT}$ and an output configured to generate an LDO voltage $V_{LDO}$. The first and second inverters 102, 103 are electrically powered using the LDO voltage $V_{LDO}$ and the ground supply $V_{GND}$.

The voltage generator 100 can be used to generate the switchable voltage $V_{SW}$ such that the switchable voltage $V_{SW}$ has a magnitude that changes based on a state of the protection control signal PROTECT. For example, when the protection control signal PROTECT is logically high, the voltage generator 100 can be configured to control the magnitude of the switchable voltage $V_{SW}$ to be greater than a magnitude of the ground supply $V_{GND}$. For example, in some implementations the LDO voltage $V_{LDO}$ can be configured to be in the range of about 1.7 V to about 1.9 V, for example, about 1.8 V, and the switchable voltage $V_{SW}$ can be configured to be about equal to the LDO voltage $V_{LDO}$ when the protection control signal PROTECT is logically high. However, the switchable voltage $V_{SW}$ can have a voltage magnitude about equal to the ground supply $V_{GND}$ when the switch is logically low. Although particular voltage levels have been described above, other voltage values will be readily determined by one of skill in the art.

With reference to FIGS. 7 and 8, the protect signal PROTECT can be asserted during any suitable time window. For example, when a voltage converter is generating an output voltage having a relatively large magnitude, inductor ringing can result in relatively large voltage spikes on the first and/or second ends of the inductor. Accordingly, in certain implementations, the protect signal PROTECT is configured to be logically high so as to increase the switchable voltage $V_{SW}$ when the voltage converter is generating a relatively large output voltage, such as a voltage that is greater than the gate-drain breakdown voltage, with respect to the ground voltage $V_{GND}$, of the second PMOS transistor 94 of the bypass circuit. Since the switchable voltage $V_{SW}$ can be provided to the body of the second NMOS transistor 96 and to the gate of the second PMOS transistor 94 through the second level shifter 92, increasing the switchable voltage $V_{SW}$ when generating a large output voltage can prevent the drain-body, drain-source, drain-gate, and/or drain-source voltages of the second PMOS and NMOS transistors 94, 96 from exceeding breakdown voltage conditions.

Figure 9:
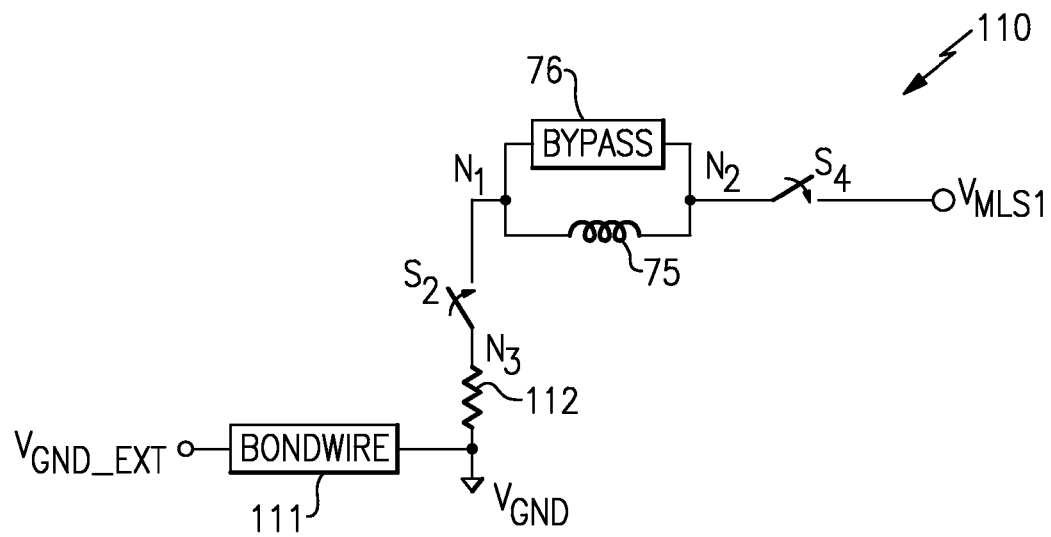
FIG. 9 is a circuit diagram of a portion of one example of a buck-boost converter.

FIG. 9 is a circuit diagram 110 of one example of a portion of a buck-boost converter. The portion of the buck-boost converter includes the bypass circuit 76, the inductor 75, the second switch $S_2$, the fourth switch $S_4$, a bondwire 111, and a resistor 112.

The bondwire 111 includes a first end electrically connected to an external ground supply $V_{GND\_EXT}$ and a second end electrically connected to the ground supply $V_{GND}$. The resistor 112 includes a first end electrically connected to the ground supply $V_{GND}$ and a second end electrically connected to a first end of the second switch $S_2$. The second switch $S_2$ further includes a second end electrically connected to a first end of the bypass circuit 76 and to a first end of the inductor 75 at the first node $N_1$. The fourth switch $S_4$ includes a first end electrically connected to a second end of the bypass circuit 76 and to a second end of the inductor 75 at the second node $N_2$. The fourth switch $S_4$ further includes a second end electrically connected to the first output voltage $V_{MLS1}$.

In some configurations, the buck-boost converter can be used to generate a boosted voltage on the first output voltage $V_{MLS1}$. For example, when the bypass circuit 76 is in a high-impedance state, the second and fourth switches $S_2$, $S_4$ are closed, and the magnetic field of the inductor 75 is relatively large, a current can flow from ground supply $V_{GND}$ to the first output voltage $V_{MLS1}$, as was described earlier in connection with FIG. 6. The flow of current through the inductor 75 can cause voltage drops across electrical components disposed along the current path, which can result in the voltage of the first node $N_1$ falling to a relatively low voltage, including a voltage less than the external ground supply $V_{GND\_EXT}$. For example, the ground supply $V_{GND}$ can be electrically connected to an external ground supply $V_{GND\_EXT}$ using the bondwire 111, which can have a resistive and/or inductive component. Voltage drops can also come from other sources, such as voltage drops associated with a resistor 112 disposed in an electrical path between the second switch $S_2$ and the ground supply $V_{GND}$ and/or voltage drops across the second switch $S_2$. In some implementations, the resistor 112 can represent the resistance of electrical components that are not passive resistors, such as transistor and/or diode structures.

With reference now to FIGS. 7 and 9, when the voltage of the first node $N_1$ falls below the ground supply $V_{GND}$, the body-drain junction of the first NMOS transistor 95 can become forward-biased. For example, the body of the first NMOS transistor 95 can be formed from a p-type well, and the drain of the first NMOS transistor 95 can be formed from an n-type active region. Accordingly, the body-drain junction of the first NMOS transistor 95 can become forward-biased when the drain voltage of the first NMOS transistor 95 decreases below the body voltage of the first NMOS transistor 95. A relatively large forward-bias of the body-drain junction can generate a bulk current that can cause damage to the first NMOS transistor 95.

Figure 10:
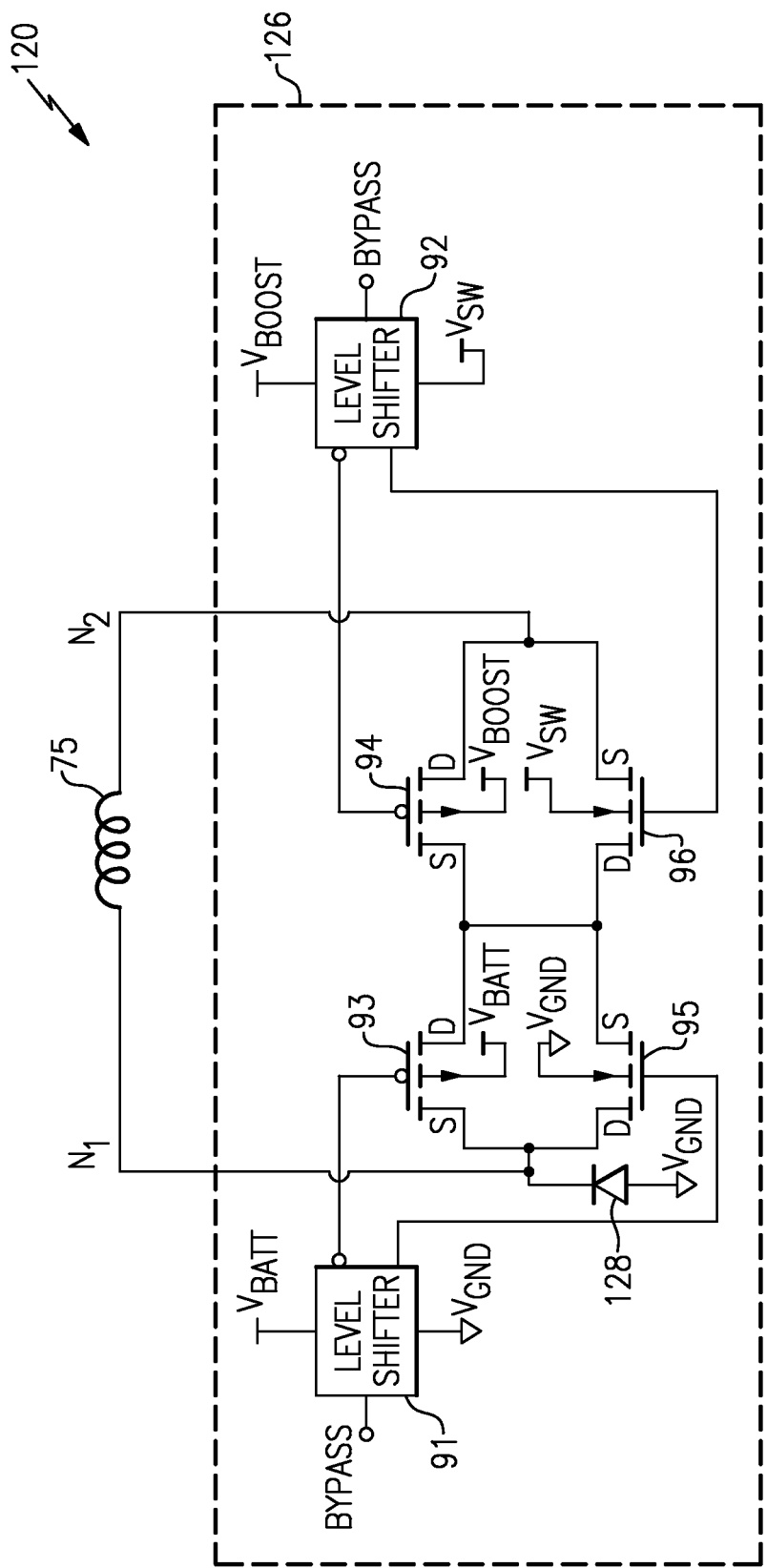
FIG. 10 is a circuit diagram of another embodiment of a bypass circuit and an inductor.

FIG. 10 is a circuit diagram 120 of another embodiment of a bypass circuit 126 and an inductor 75. The bypass circuit 126 includes the first level shifter 91, the second level shifter 92, the first PMOS transistor 93, the second PMOS transistor 94, the first NMOS transistor 95, the second NMOS transistor 96, and a diode 128. The bypass circuit 126 includes an input for receiving a bypass control signal BYPASS, and the bypass circuit 126 is electrically connected in parallel with the inductor 75.

The bypass circuit 126 of FIG. 10 is similar to the bypass circuit 86 of FIG. 7. However, in contrast to the bypass circuit 86 of FIG. 7, the bypass circuit 126 of FIG. 10 further includes the diode 128. For example, the diode 128 includes an anode electrically connected to the ground supply $V_{GND}$ and a cathode electrically connected to the first node $N_1$. Including the diode 128 can aid in protecting the first NMOS transistor 95 from damage when the first node $N_1$ falls below the ground supply $V_{GND}$. For example, the diode 128 can be configured to have a relatively large size, and thus can conduct a relatively large current where first node $N_1$ falls below the ground supply $V_{GND}$, thereby helping to increase the voltage of the first node $N_1$ and to prevent the body-source junction of the first NMOS transistor 95 from conducting a relatively large current.

Figure 11:
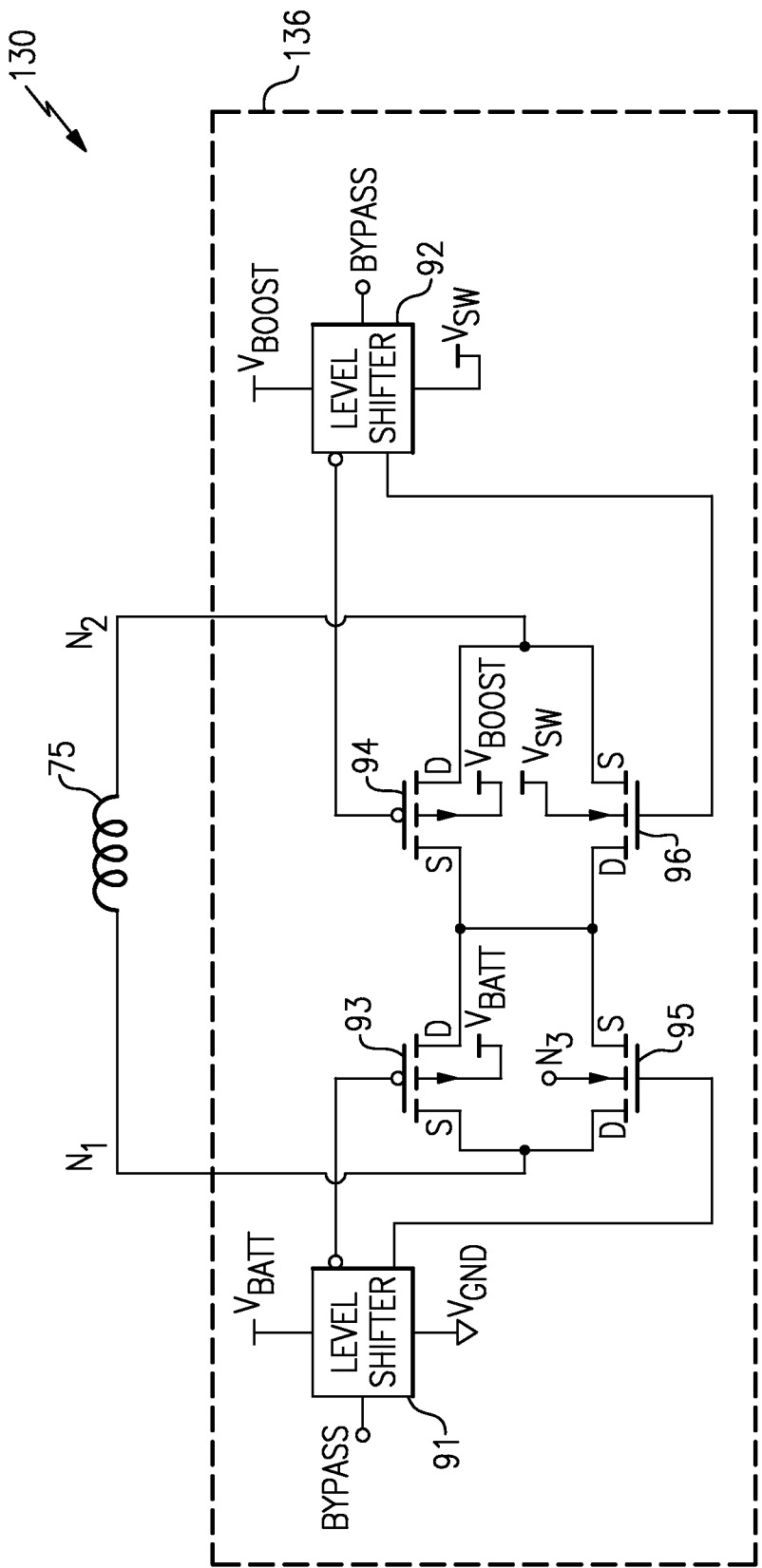
FIG. 11 is a circuit diagram of yet another embodiment of a bypass circuit and an inductor.

FIG. 11 is a circuit diagram 130 of yet another embodiment of a bypass circuit 136 and an inductor 75. The bypass circuit 136 includes the first level shifter 91, the second level shifter 92, the first PMOS transistor 93, the second PMOS transistor 94, the first NMOS transistor 95, and the second NMOS transistor 96. The bypass circuit 136 includes an input for receiving a bypass control signal BYPASS, and the bypass circuit 136 is electrically connected in parallel with the inductor 75.

The bypass circuit 136 of FIG. 11 is similar to the bypass circuit 86 of FIG. 7. However, in contrast to the bypass circuit 86 of FIG. 7, the body of the first NMOS transistor 95 is electrically connected to a third node $N_3$ rather than to the ground supply $V_{GND}$. In certain implementations, the third node $N_3$ can correspond to the third node $N_3$ of FIG. 9. Accordingly, in some configurations the body of the first NMOS transistor 95 can be electrically connected to a node within the voltage converter disposed in a current path between a switch of the voltage converter and a resistor of the voltage converter.

Applications

Some of the embodiments described above have provided examples in connection with mobile phones. However, the principles and advantages of the embodiments can be used for any other systems or apparatus that have needs for voltage converters.

Such voltage converters can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A voltage conversion system comprising:
a voltage converter including an inductor and a plurality of switches configured to control a current through the inductor; and
a bypass circuit including a first p-type field effect transistor (PFET), a second PFET, a first n-type field effect transistor (NFET), and a second NFET, the first and second NFET transistors and the first and second PFET transistors electrically connected between a first end and a second end of the inductor such that a source of the first PFET transistor and a drain of the first NFET transistor are electrically connected to the first end of the inductor and such that a drain of the second PFET transistor and a source of the second NFET transistor are electrically connected to the second end of the inductor.

2. The voltage conversion system of claim 1 wherein a drain of the first PFET transistor is electrically connected to a source of the second PFET transistor, to a source of the first NFET transistor, and to a drain of the second NFET transistor.

3. The voltage conversion system of claim 1 wherein a body of the first PFET transistor is electrically connected to a battery voltage and a body of the first NFET transistor is electrically connected to a ground voltage.

4. The voltage conversion system of claim 3 wherein a body of the second PFET transistor is electrically connected to a boost voltage, the boost voltage having a magnitude greater than the battery voltage.

5. The voltage conversion system of claim 4 wherein a body of the second NFET transistor is electrically connected to a switchable voltage, the switchable voltage configured to be switched between a voltage equal to about the ground voltage and a voltage greater than the ground voltage based on a magnitude of an output voltage generated by the voltage converter.

6. The voltage conversion system of claim 5 further comprising a first level shifter and a second level shifter, the first level shifter configured to generate gate control signals for a gate of the first PFET transistor and for a gate of the first NFET transistor, and the second level shifter configured to generate gate control signals for a gate of the second PFET transistor and for a gate of the second NFET transistor.

7. The voltage conversion system of claim 6 wherein the first level shifter is electrically powered using the battery voltage and the ground voltage and the second level shifter is electrically powered using the boost voltage and the switchable voltage so as to prevent the second PFET transistor from breakdown between the gate and the drain.

8. The voltage conversion system of claim 5 further comprising an inverter and a low drop-out regulator configured to generate a regulated voltage, the inverter electrically powered using the regulated voltage and the ground voltage, the output of the inverter configured to generate the switchable voltage based on an input protection control signal.

9. The voltage conversion system of claim 3 further comprising a diode having an anode electrically connected to the ground supply and a cathode electrically connected to the drain of the first NFET transistor, the diode configured to protect the first NFET transistor from damage when the first end of the inductor has a voltage less than the ground voltage.

10. The voltage conversion system of claim 1 wherein the plurality of switches of the voltage converter includes a switch having a first end electrically connected to the first end of the inductor and a second end electrically connected to a ground supply.

11. The voltage conversion system of claim 10 further comprising an electrical component disposed in an electrical path between the second end of the switch and the ground supply, the electrical component having a resistance.

12. The voltage conversion system of claim 10 wherein a body of the first NFET transistor is electrically connected to the second end of the switch.

13. The voltage conversion system of claim 1 wherein the voltage converter includes a switch control block configured to control the plurality of switches to generate a plurality of output voltages.

14. A bypass circuit for a voltage converter including an inductor and a plurality of switches configured to control a current through the inductor, the bypass circuit comprising:
a first p-type field effect transistor (PFET) transistor;
a first n-type field effect transistor (NFET) transistor having a drain electrically connected to a source of the first PFET transistor and to a first end of the inductor;
a second PFET transistor having a source electrically connected to a drain of the first PFET transistor; and
a second NFET transistor having a drain electrically connected to a source of the first NFET transistor and a source electrically connected to a drain of the second PFET transistor and to a second end of the inductor.

15. The bypass circuit of claim 14 wherein the drain of the first PFET transistor is electrically connected to the source of the first NFET transistor and to the drain of the second NFET transistor.

16. The bypass circuit of claim 14 wherein the first and second PFETs are each p-type metal oxide semiconductor (PMOS) transistors and the first and second NFETs are each n-type metal oxide semiconductor (NMOS) transistors.

17. The bypass circuit of claim 14 wherein a body of the first PFET transistor is electrically connected to a battery voltage and a body of the first NFET transistor is electrically connected to a ground voltage.

18. The bypass circuit of claim 17 wherein a body of the second PFET transistor is electrically connected to a boost voltage, the boost voltage having a magnitude greater than the battery voltage.

19. The bypass circuit of claim 18 wherein a body of the second NFET transistor is electrically connected to a switchable voltage, the switchable voltage configured to be switchable between a voltage equal to about the ground voltage and a voltage greater than the ground voltage.

20. The bypass circuit of claim 19 further comprising a first level shifter and a second level shifter, the first level shifter configured to generate gate control signals for a gate of the first PFET transistor and for a gate of the first NFET transistor, and the second level shifter configured to generate gate control signals for a gate of the second PFET transistor and for a gate of the second NFET transistor.

21. The bypass circuit of claim 20 wherein the first level shifter is electrically powered using the battery voltage and the ground voltage and the second level shifter is electrically powered using the boost voltage and the switchable voltage so as to prevent the second PFET transistor from breakdown between the gate and the drain.

22. The bypass circuit of claim 17 further comprising a diode having an anode electrically connected to the ground supply and a cathode electrically connected to the drain of the first NFET transistor, the diode configured to protect the first NFET transistor from breakdown between the body and the drain when the first end of the inductor has a voltage less than the ground voltage.

23. A method of reducing ringing in a voltage converter, the method comprising:
generating a plurality of output voltages using the voltage converter, the voltage converter including an inductor and a plurality of switches for controlling a current through the inductor; and
bypassing the inductor using a bypass circuit, the bypass circuit including a first p-type field effect transistor (PFET), a second PFET, a first n-type field effect transistor (NFET), and a second NFET, the first and second NFET transistors and the first and second PFET transistors electrically connected between a first end and a second end of the inductor such that a source of the first PFET transistor and a drain of the first NFET transistor are electrically connected to the first end of the inductor and such that a drain of the second PFET transistor and a source of the second NFET transistor are electrically connected to the second end of the inductor.

24. The method of claim 23 further comprising biasing a body of the second PFET transistor at a voltage that is greater than a voltage of a body of the first PFET transistor.

25. The method of claim 24 further comprising biasing a body of the first NFET transistor to a ground voltage and biasing a body of the second NFET transistor to a switchable voltage.

26. The method of claim 24 further comprising increasing the voltage of the switchable voltage above that of the ground voltage when generating at least one of the plurality of output voltages.

27. A wireless device comprising:
a battery having a battery voltage;
a voltage converter including an inductor and a plurality of switches configured to control a current through the inductor, the voltage converter configured to generate a plurality of output voltages from the battery voltage; and
a bypass circuit including a first p-type field effect transistor (PFET), a second PFET, a first n-type field effect transistor (NFET), and a second NFET, the first and second NFET transistors and the first and second PFET transistors electrically connected between a first end and a second end of the inductor such that a source of the first PFET transistor and a drain of the first NFET transistor are electrically connected to the first end of the inductor and such that a drain of the second PFET transistor and a source of the second NFET transistor are electrically connected to the second end of the inductor.

28. The wireless device of claim 27 wherein a drain of the first PFET transistor is electrically connected to a source of the second PFET transistor, to a source of the first NFET transistor, and to a drain of the second NFET transistor.

29. The wireless device of claim 28 wherein a body of the first PFET transistor is electrically connected to the battery voltage and a body of the first NFET transistor is electrically connected to a ground voltage.

30. The wireless device of claim 29 wherein a body of the second PFET transistor is electrically connected to a boost voltage, the boost voltage having a magnitude greater than the battery voltage.

31. The wireless device of claim 30 wherein a body of the second NFET transistor is electrically connected to a switchable voltage, the switchable voltage configured to be switched between a voltage equal to about the ground voltage and a voltage greater than the ground voltage based on a magnitude of one of the plurality of output voltages generated by the voltage converter.

32. The wireless device of claim 31 further comprising a first level shifter and a second level shifter, the first level shifter configured to generate gate control signals for a gate of the first PFET transistor and for a gate of the first NFET transistor, and the second level shifter configured to generate gate control signals for a gate of the second PFET transistor and for a gate of the second NFET transistor.

33. The wireless device of claim 32 wherein the first level shifter is electrically powered using the battery voltage and the ground voltage and the second level shifter is electrically powered using the boost voltage and the switchable voltage so as to prevent the second PFET transistor from breakdown between the gate and the drain.

34. The wireless device of claim 27 further comprising a plurality of output switches and a voltage adjustment module, the plurality of output switches configured to select amongst the plurality of output voltages, and the voltage adjustment module configured to generate a power amplifier supply voltage by adjusting a voltage magnitude of the selected output voltage.

35. The wireless device of claim 34 further comprising a power amplifier configured to receive the power amplifier supply voltage.

36. The wireless device of claim 34 wherein the plurality of output voltages includes at least one output voltage having a magnitude greater than a magnitude of the battery voltage.

37. The wireless device of claim 34 wherein the plurality of output voltages includes at least one output voltage having a magnitude less than a magnitude of the battery voltage.

* * * * *